US009766751B2

(12) United States Patent
Nys et al.

(10) Patent No.: US 9,766,751 B2
(45) Date of Patent: Sep. 19, 2017

(54) TOUCH PANEL CALIBRATION SYSTEM

(71) Applicant: Semtech Corporation, Camarillo, CA (US)

(72) Inventors: Olivier Nys, Neuchâtel (CH); Pascal Monney, San Diego, CA (US)

(73) Assignee: Semtech Corporation, Camarillo, CA (US)

( * ) Notice: Subject to any disclaimer, the term of this patent is extended or adjusted under 35 U.S.C. 154(b) by 109 days.

(21) Appl. No.: 14/604,816

(22) Filed: Jan. 26, 2015

(65) Prior Publication Data
US 2015/0220209 A1 Aug. 6, 2015

(30) Foreign Application Priority Data

Feb. 4, 2014 (EP) .................................. 14153766

(51) Int. Cl.
G06F 3/041 (2006.01)
G06F 3/044 (2006.01)
G01R 35/00 (2006.01)

(52) U.S. Cl.
CPC ......... G06F 3/0418 (2013.01); G01R 35/005 (2013.01); G06F 3/044 (2013.01)

(58) Field of Classification Search
CPC . G01R 35/005; G01R 27/2605; G06F 3/0418; G06F 3/044; G01D 5/24; G01D 5/2417; G01L 9/12; G01P 15/125
See application file for complete search history.

(56) References Cited

U.S. PATENT DOCUMENTS

| | | | | |
|---|---|---|---|---|
| 7,863,966 B1* | 1/2011 | Chuang | ................... | G06F 3/044 327/517 |
| 8,508,493 B2* | 8/2013 | Souchkov | ............. | G06F 3/0416 345/173 |
| 2009/0066674 A1* | 3/2009 | Maharyta | ............ | G06F 3/03547 345/178 |
| 2009/0295747 A1* | 12/2009 | Hsieh | ...................... | G06F 3/044 345/173 |
| 2010/0079406 A1* | 4/2010 | Chen | ....................... | G06F 3/044 345/174 |
| 2011/0012618 A1* | 1/2011 | Teterwak | .................. | G01D 5/24 324/607 |
| 2011/0018558 A1* | 1/2011 | Saito | ..................... | G06F 3/0338 324/676 |
| 2011/0310052 A1* | 12/2011 | Souchkov | ............... | G06F 3/044 345/174 |
| 2011/0310054 A1* | 12/2011 | Souchkov | ............... | G06F 3/044 345/174 |
| 2012/0056663 A1* | 3/2012 | Oh | ........................ | G06F 3/0412 327/517 |
| 2012/0169701 A1* | 7/2012 | Son | ....................... | G06F 3/0416 345/211 |
| 2012/0256868 A1* | 10/2012 | Choi | ........................ | G06F 3/044 345/174 |

(Continued)

Primary Examiner — Jermele M Hollington
Assistant Examiner — Suresh K Rajaputra
(74) Attorney, Agent, or Firm — Blank Rome LLP

(57) ABSTRACT

A readout system for capacitive touch panel, particularly for single-ended capacity sensing matrixes, capable of internally calibrate and equalize the response of its capacity-to-digital converters (CDC). The readout system includes reference lines for interconnecting together different sub-circuits, and measuring the response of CDC in different circuits on common reference capacitors.

8 Claims, 7 Drawing Sheets

(56) References Cited

U.S. PATENT DOCUMENTS

| | | | | |
|---|---|---|---|---|
| 2012/0256869 A1* | 10/2012 | Walsh | ................... | G06F 3/0416 345/174 |
| 2013/0016061 A1* | 1/2013 | Souchkov | ............... | G06F 3/044 345/174 |
| 2013/0176280 A1* | 7/2013 | Wu | ....................... | G06F 3/0416 345/174 |

* cited by examiner

TOUCH PANEL CALIBRATION SYSTEM

RELATED APPLICATIONS

This application claims priority to European Application No. EP14153766.2, filed Feb. 4, 2014. The contents of that application are herein incorporated by reference.

FIELD OF THE INVENTION

The present invention concerns, among others, capacitive detection of conductive bodies in proximity to an electrode or to an array of electrodes, such as used in capacitive touch screens. In embodiments, the capacitor to detect is created between one electrode and a finger or pen approaching thereto, such that the second electrode may be considered as referred to ground.

DESCRIPTION OF RELATED ART

Capacitive sensor arrays such as those in capacitive touchscreens are ubiquitous in today's human-to-device interaction. As depicted in FIGS. 1a and 1b, such devices can be grouped into two main divisions:
differential (mutual) capacitance sensing matrix
This is the technology most represented in the market. The sensor arrays typically comprise a matrix of electrodes arranged in rows and columns, and a dedicated circuitry sensing the line-to-line capacitance. The performances of these systems can be excellent when the user touches the screen (sensing of x/y coordinates) or approaches considerably, typically less than a few millimetres, the sensing array, but they degrade quickly with the increase of the distance z between the panel and finger, such that these sensors are not well suited for touch-less applications like hovering.
single-ended (self) capacitance sensing matrix
These sensors include an array of individual pixels that measure an absolute capacitance to ground. They combine an excellent performance in x, y and z, allowing for touch-less or "3D" sensing, as well as behaving better with gloved hands and styli, and offering unlimited multi-touch sensing. Compared to the previous group, these higher performances come at the expense of more complex panel and sensor routing, and associated circuitry.

To guarantee high performance i.e. to reduce errors introduced by sensor and sensing circuitry, all matrix sensors must have matched and accurate capacitance measurements. In the case of self capacitance array measurements, best performance is achieved when ensuring uniform capacitance readings among all channels/sensors (equalized channel readings) as well as absolute capacitance value measurement. Specific advanced test and calibration systems and methods must be used to reach these goals.

Known systems typically attempt to test and calibrate a given capacitance-sensitive stage inside an integrated circuit (IC) by itself during a single IC production test, possibly against a known external reference capacitance. This operation is not trivial and does neither offer the possibility of equalizing the transfer function among different stages or different IC, nor of recalibrating or dynamically adapting the transfer function in the application or during operation.

BRIEF SUMMARY OF THE INVENTION

This invention proposes new systems and methods to test and calibrate capacitive sensor array systems. Compared to prior art, the new system and methods offer the following advantages:

inexpensive, low complexity, flexibility
ability to measure and calibrate at different levels:
  during integrated circuit (IC) production test; e.g. on automated test equipment (ATE)
  in-situ on the final application system with touchscreen module
  "on-the-fly" or dynamically during touchscreen usage; e.g. to compensate for environmental changes (e.g. temperature, user conditions)

According to the invention, these aims are achieved by means of the object of the appended claims.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1A:
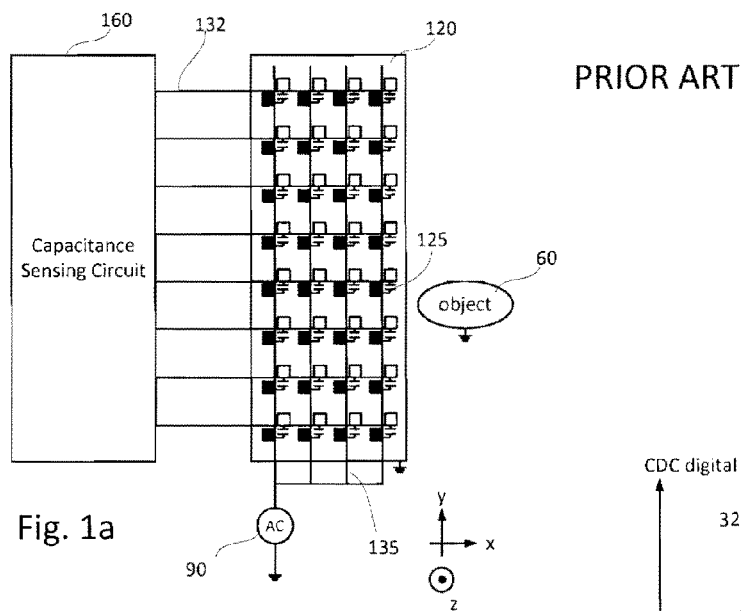
FIGS. 1a and 1b shows schematically the general structure of differential and single-ended capacitive touch-sensitive devices as known in the art
Figure 1B:
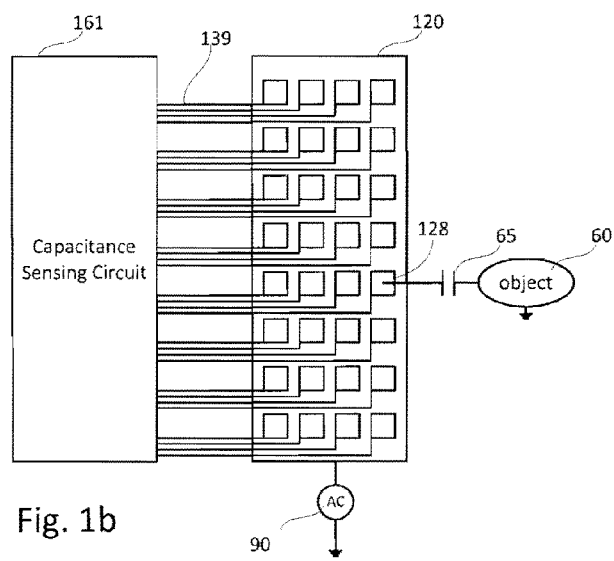

Some aspects of the invention that are in common with other known solution will now be reviewed with reference to FIGS. 1a and 1b. FIG. 1 represents a known capacitive touch panel 120 comprising a rectangular regular grid of capacitive sensors 125. In the illustrated example the grid comprises eight rows of four sensors although the number of sensors in most concrete realizations would be considerably higher. The sensors 125 are inserted between the row lines 132 and the column lines 135 that are connected to the sensing circuit 160 and respectively to the modulation source 90. The proximity of a conductive object 60 is detected by a variation (in general a decrease) of the capacity of the nearby sensors.

FIG. 1b illustrates a possible realization of a single-ended capacitive sensor. In this realization, the capacitive sensors are individual pixels 128 that are not matrix-addressed, as in the previous example, but individually connected to the sensing circuit 161 by the connection lines 139. The capacitive pixels 128 are biased at a fixed voltage with respect to a common reference conductor, that can be regarded as a floating ground reference, and which is driven by the modulation source 90, such that the capacitance sensing circuit can read the capacity between each of the capacitive 'pixels' 128 and a neighbouring conductive body 60, for example a finger. Since it can be assumed that the body 60 is grounded, or at a fixed potential with respect to the ground, its approach is indicated by an increase of the capacitance to ground of the nearby pixels 128.

Figure 3:
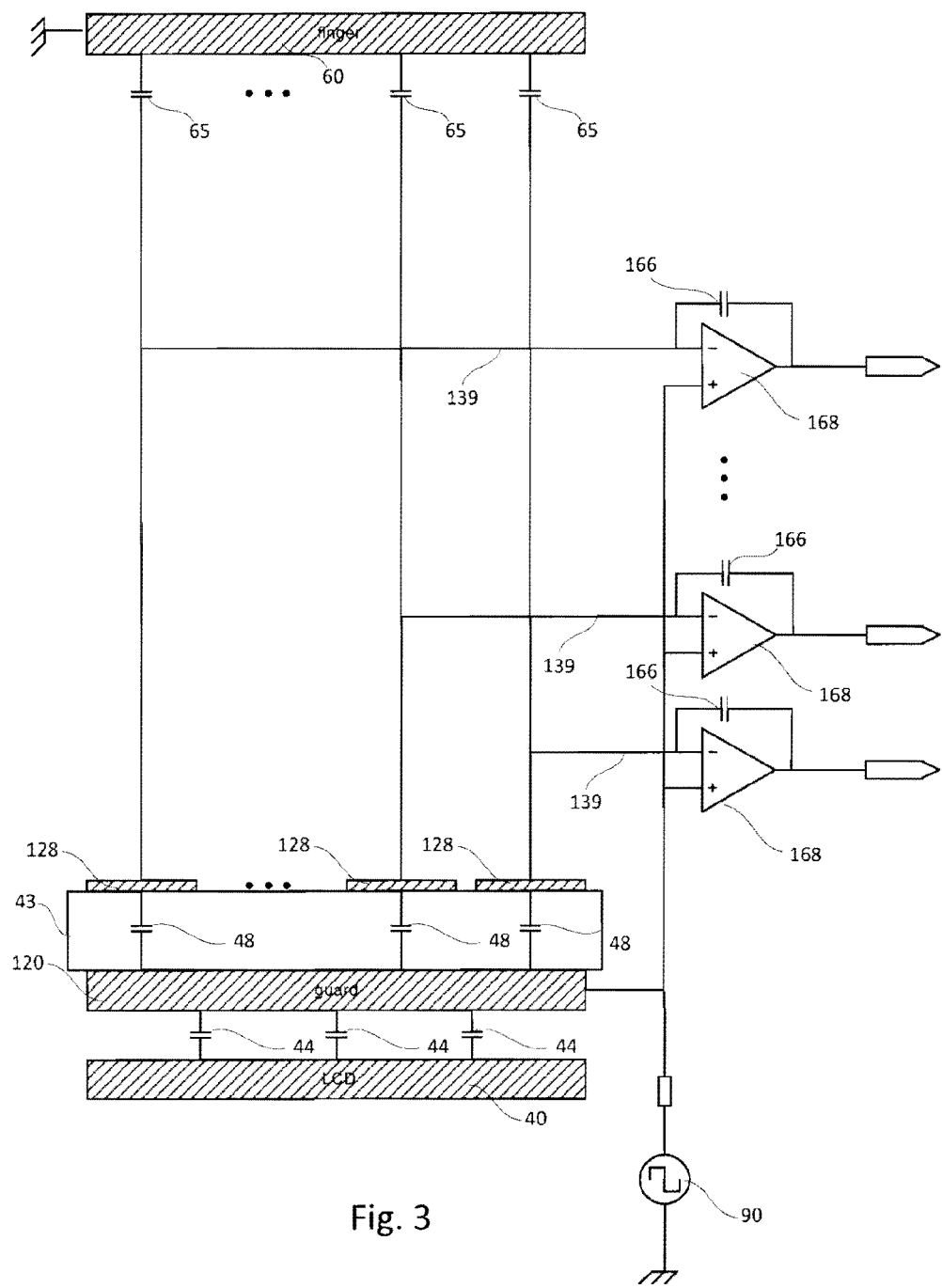
FIG. 3 illustrates schematically an aspect of the readout system of the invention.

FIG. 3 represents schematically an aspect of the detection principle of the invention. The sense pixels 128 are deposited on a suitable substrate 43, possibly a transparent substrate that has the sense pixels 128 on one face, and the guard electrode 120 on the other, as represented, and that is placed above the LCD display 40. The sense pixels 128 are individually connected, by the sense lines 193, to the input terminals of the respective CDC 168, which are here represented by a possible realization of the analogue input stage only, for simplicity.

According to an important aspect of the invention, the CDC 168 are referred to the potential of the guard electrode 120, and their input terminals are at the same potential as the guard electrode, or maintain a constant voltage with respect thereto. In the represented example, the CDC 168 have an input stage that is configured as a charge amplifier, but other dispositions are possible. Thanks to this, the readout system of the invention is relatively insensitive to the capacities 48 between the pixels 128 and the ground electrode 120, and also to the inter-pixel capacities (not represented). When the guard electrode is excited by the modulation source 90, the CDC stages 168 read a signal has the same shape as the modulation signal and whose amplitude is in first approximation proportional to the capacities 65 between each pixel and the nearby body 60, the ratio being determined, among others, by the values of the feedback capacitors 166 of each stage.

Figure 2:
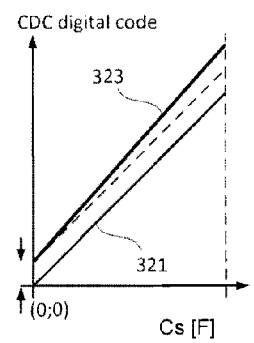
FIG. 2 is a plot of the response functions of an ideal Capacitance-to-Digital Converter (CDC) and of a real CDC having offset and gain variations.

An aspect of the invention concerns a capacitive touch sensitive device that includes a CDC that is arranged to measure a capacitance present to its input and deliver the measured value as a digital code. A concrete realization of a touch sensitive device may need to read a very large number of capacity sensitive electrodes in parallel, and to this end include a plurality of capacitance-to-digital stages either in a single integrated circuit or in a plurality of integrated circuits. The capacitance-to-digital converter compares the value of the input capacitance with that of a reference capacitance, typically an internal capacitor on chip, by measuring the amplitude of a modulation voltage at the input terminals. Formally it can be characterized by a transform function:

$$\text{code} = k \cdot \frac{C_s}{C_i} \cdot \frac{V_{mod}}{V_{ref}} \quad (1)$$

where:
k constant (determined for example by design)
$C_s$ input capacitance to be measured
$C_i$ internal/on chip reference capacitance
$V_{mod}$ modulation voltage
$V_{ref}$ reference voltage $C_i$ typically varies from stage to stage within a circuit due to fabrication tolerances and mismatches, as well as from circuit to circuit. All capacitive converter stages in the same circuit may share a common $V_{ref}$, but this reference value may vary from a circuit to another. Finally, $V_{mod}$ is common to the system. This leads to CDC transfer function (TF) errors, both in offset and gain, varying from stage to stage. FIG. 2 illustrates an ideal transfer function 321 in which the code output code (y axis) follows the equation 1, as well as a real transfer function 323 that is affected by offset and slope errors and deviates from the ideal behaviour. Even if it is not represented in the figure, the real transfer function may also include integral and differential nonlinearities and other higher order errors.

Figure 4:
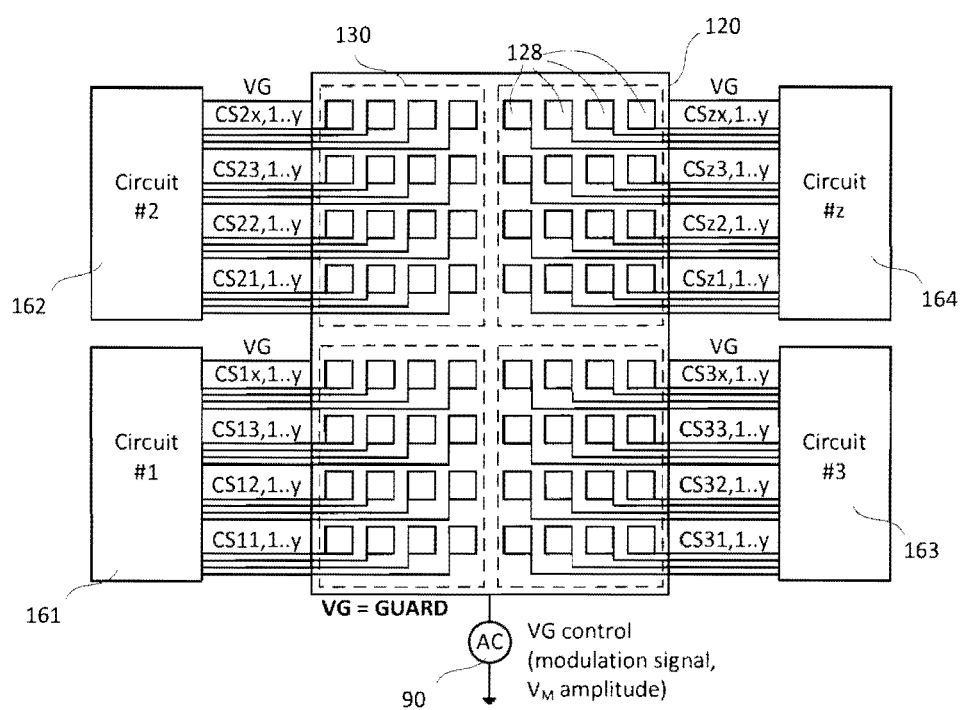
FIG. 4 illustrates schematically a tactile system comprising a matrix of capacity-sensitive electrodes divided in groups, each group being read by an independent circuit.

FIG. 4 illustrates schematically a possible structure of a capacitive touch panel according to one aspect of the invention. A sensitive surface 120 is covered with a matrix of capacitive sensors 128, each comprising an electrode that constitutes a tiny capacitor together with a common guard electrode 130. The capacitance of the individual sensors is read by one or several circuits 161, 162, 163, 164, each of which is connected to a group of electrodes. The guard electrode is preferably connected to a source of variable voltage 90 that allows measuring the capacity of the individual electrodes 128.

Figure 5:
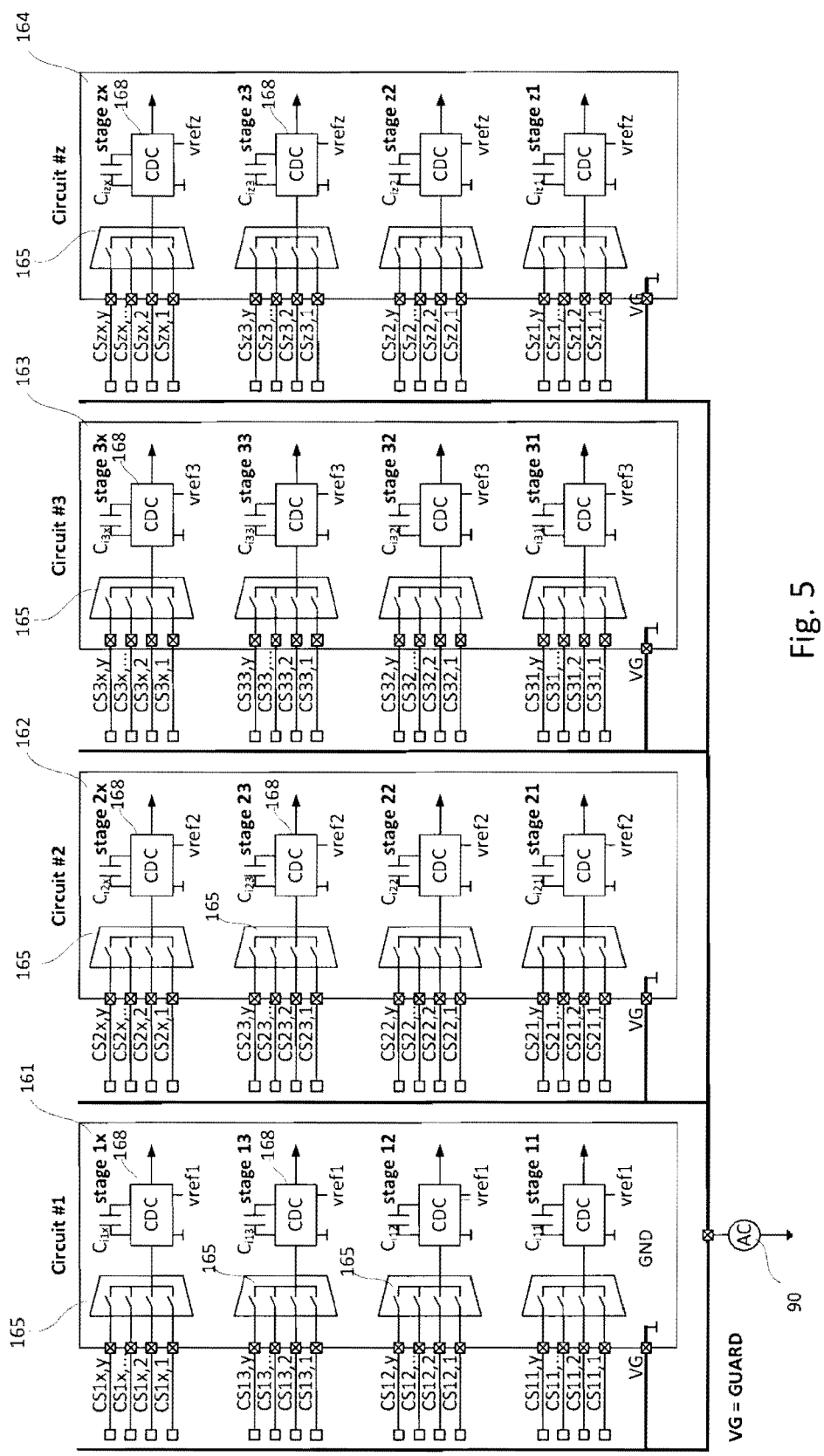
FIG. 5 illustrates a possible interconnection of several circuits, each of which has a plurality of CDC stages, to read a matrix of capacity-sensitive electrodes.

FIG. 5 shows a possible embodiment of the invention in which a readout apparatus connectable to a capacitive touch panel comprises several capacitive readout integrated circuits 161, 162, 163, 164, each of which includes a plurality of CDC 168 as capacitance-measuring units arranged to provide a signal representative of a capacity of electrodes on the capacitive touch panel, that are connected by the signal lines CSi,xy etc. and the multiplexers 165. Importantly the readout apparatus has at least one reference capacitor that is selectively connectable to either input of the CDCs 168. Preferably, each of the circuits has a calibration mode in which the CDCs input are connected in turn to the reference capacitor.

Importantly the invention includes features that allow equalizing, compensating, or correcting the differences of CDC transfer functions between stages, at the IC level or between different IC at the system level. Mathematically, the function that need be equalized between stages is $1/C_i \cdot V_{mod}/V_{ref}$.

Figure 6:
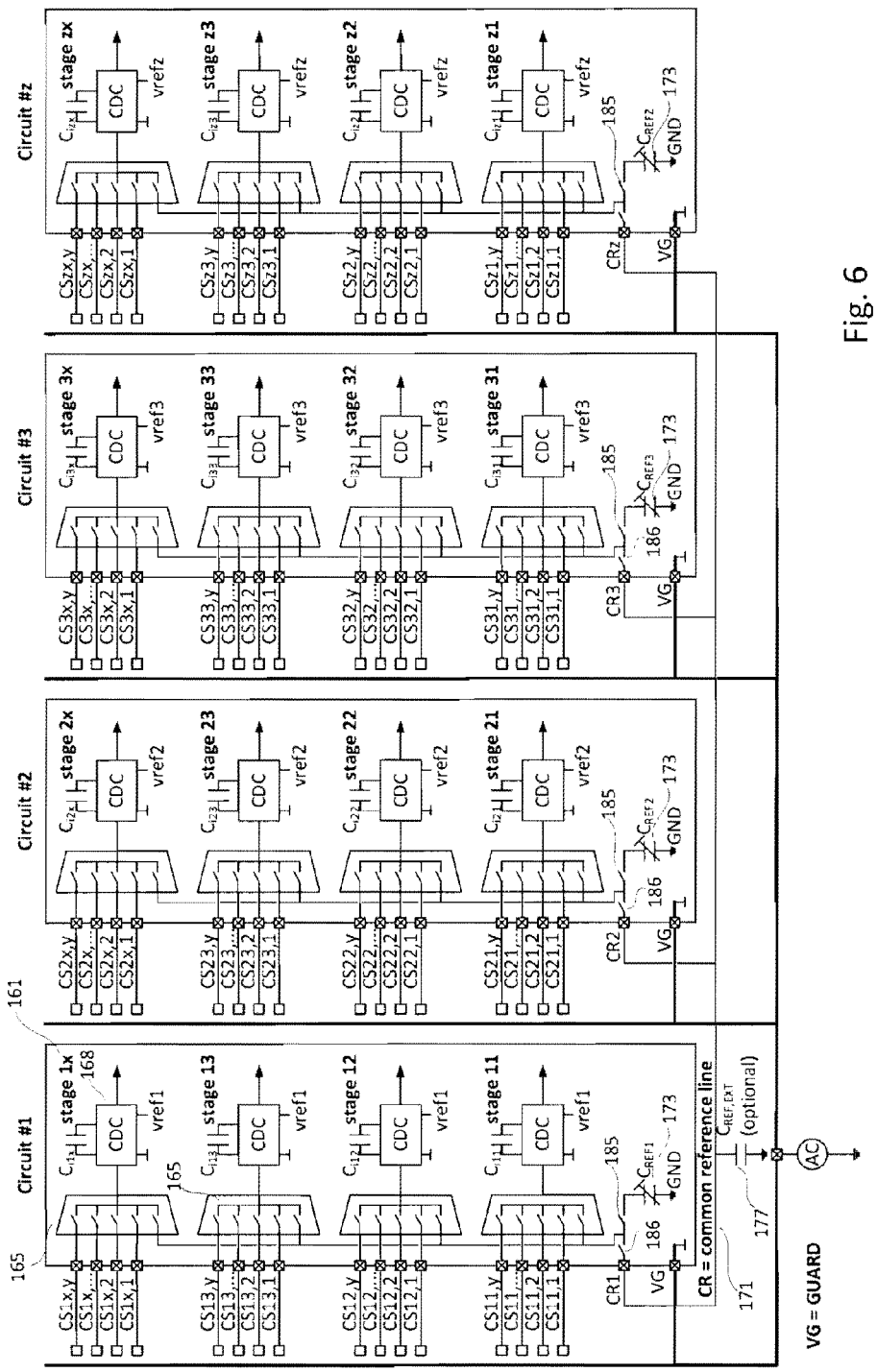
FIG. 6 illustrates an interconnection scheme similar to that of FIG. 5 including a shared capacitance reference line.
Figure 7:
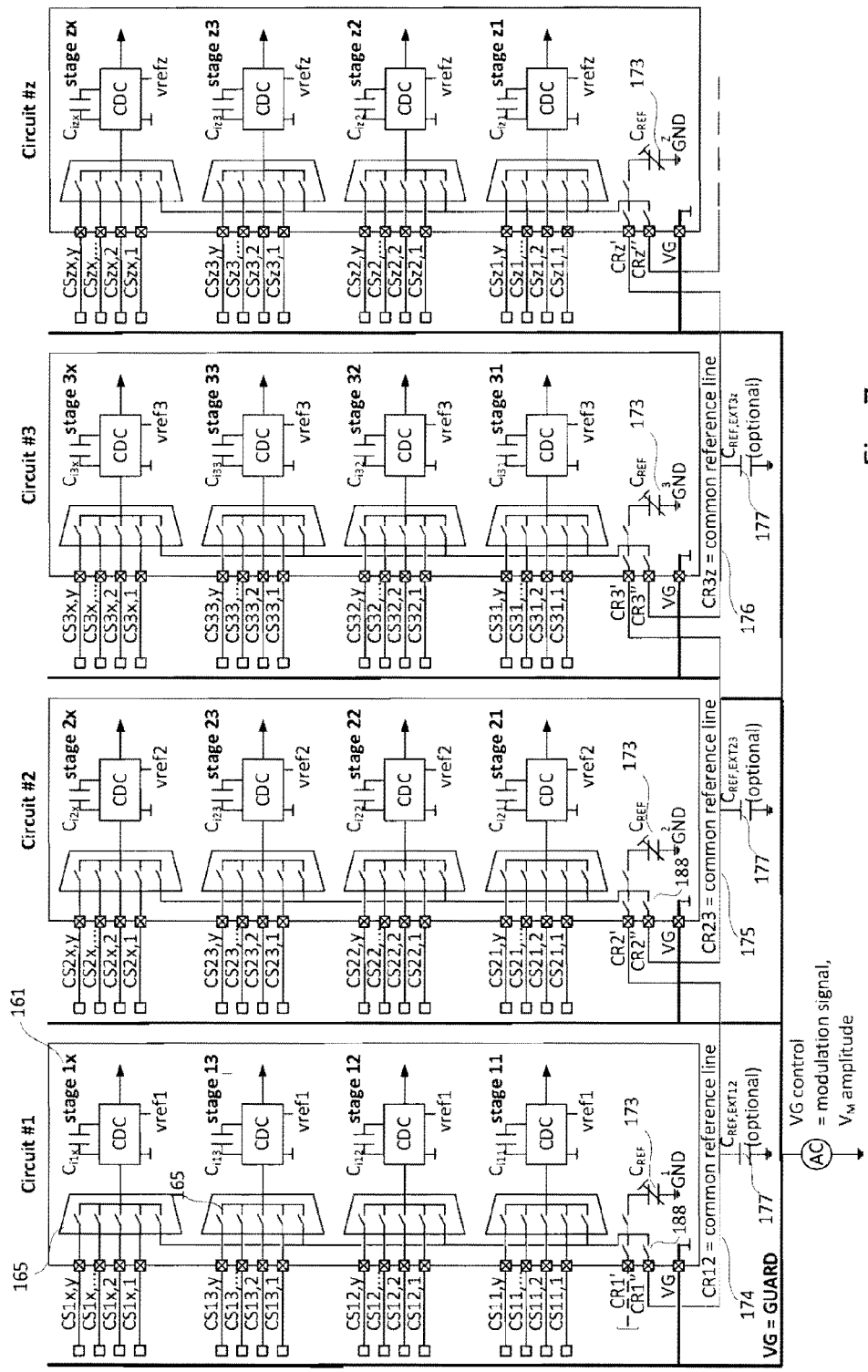
FIG. 7 illustrates an interconnection scheme similar to those of FIGS. 5 and 6 including a daisy-chained capacitance reference line.

According to an important aspect illustrated in FIGS. 6 and 7, the invention includes one or several on-chip test capacitor Cref 173 and preferably switching means 185, 186 arranged to measure the CDC response for each stage, thus allowing channel equalization as a part of the overall circuit calibration.

Preferably, the on-chip test capacitors 173 are variable devices whose capacitance can be selectively changed, for example by a digital control signal. This feature enables measuring of the response of the CDC stages 161 for two or more values of the input capacitance. Such variable capacitors can be realized by switched banks of fixed capacitors, or any other suitable way.

Another important aspect of the invention is the presence of common reference capacitance lines 171, 174, 175, 176 that allow, in an automatic calibration procedure, to measure the same internal or external capacitance by all the CDC stages in all the circuits of the touch-sensitive readout. This cross-measurement allows an accurate equalization of all the stages transfer functions between circuits and stages. Considering a linear system, a two point measurement is sufficient for removing offset and slope errors from the transfer function.

The calibration can be carried out against internal capacitors 173 inside the circuits, or also, if required, against an external reference capacitor 177 connected on common reference capacitance lines.

The variants illustrated by FIGS. 6 and 7 differ in the way in which the common reference lines are used. In the former, a single common reference line 171 is used among all circuits, while in the latter it is a daisy-chained system with shared lines 174, 175, 176 between pairs of adjacent circuits.

Figure 8:
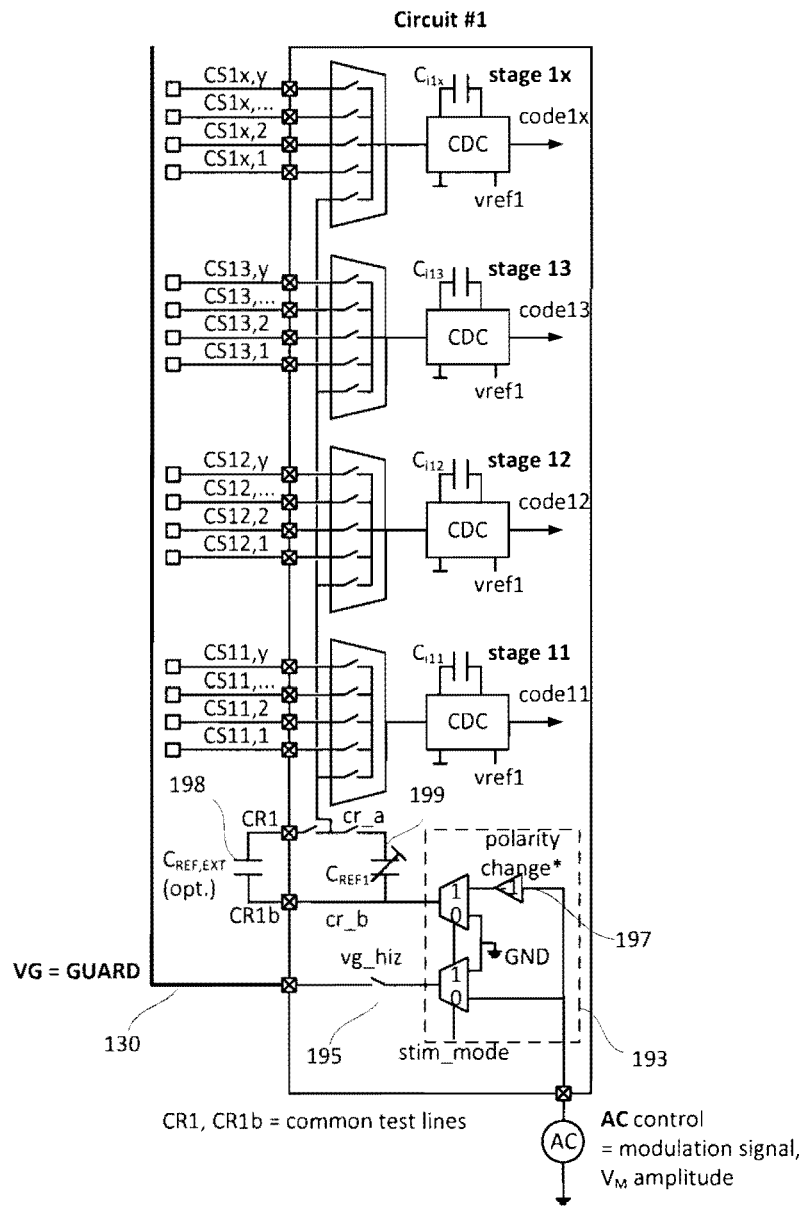
FIG. 8 shows schematically a capacitive-sensitive circuit including additional means for measuring a floating capacitor

FIG. 8 represents a variant of the invention that allows the measure of floating/mutual capacitor. For simplicity, only one integrated circuit is represented. The circuit includes a stimulation mode selector unit 193 that changes the capacitor testing method according to the logical value present at its 'stim_mode' input: in a normal mode, selectable by setting the 'stim_mode' to the 0 value, the VG terminal, connected to the guard electrode 130 of the touch panel is driven by the AC modulation source 90, and the cr_b line that is connected to the reference capacitors Cref1 and Cref,ext is tied to ground potential; in a floating measure mode, selectable by setting the 'stim_mode' input to the '1' value, the VG terminal is set to ground, and the AC modulation signal is instead applied to the cr_b line that sets the reference voltage capacitors Cref1 and Cref,ext. Preferably, the circuit include a polarity inversion stage 197 that is applied to the AC control signal in the floating measure mode, such that the polarity of the signal measured by the CDC stages remains the same as in the normal mode.

The arrangement of FIG. 8 allows switching around the guard stimulation signal to move the reference point, actually emulating a mutual capacitance sensing. Advantageously, this measure is insensitive to parasitic capacitances.

EXAMPLES

Turning now to the circuit represented in FIG. 6, an automatic capacitance calibration with one integrated circuit may proceed as follows:
measure 1st capacitance point
connect internal Cref1 to stage 11 CDC; select a 1st Cref1 value, may be typically selected to be 0 fF capacitance
measure Cref1 with CDC stage 11; store code 11
repeat above step for stages 12, 13, . . . , 1x; store all stage codes
measure 2nd capacitance point
connect internal Cref1 to stage 11 CDC; select a 2nd Cref1 value different from that of measurement #1
measure Cref1 with CDC stage 11; store code 11
repeat above step for stages 12, 13, . . . , 1x; store all stage codes
(optionally: measure more capacitance points by changing internal Cref1 value; e.g. 3rd, 4th etc. capacitance points)
extract all offset and relative gain errors for each stage and correct to equalize all stages; e.g. digital/software post-processing correction on the codes using simple linear regression on 2 points (or more)

In the case of a multiple-IC implementation, a capacitance calibration using on-chip reference capacitors may develop as follows:
measure IC 1:
measure 1st capacitance point
connect internal Cref1 to stage 11 CDC (disconnect Cref,ext, unused); select a 1st Cref1 value, may be typically selected to be 0 fF capacitance
measure Cref1 with CDC stage 11; store code 11
repeat above step for stages 12, 13, . . . , 1x; store all stage codes
measure 2nd capacitance point
connect internal Cref1 to stage 11 CDC (disconnect Cref,ext, unused); select a 2nd Cref1 value different from that of 1st capacitance measurement
measure Cref1 with CDC stage 11; store code 11
repeat above step for stages 12, 13, . . . , 1x; store all stage codes
optionally: measure more capacitance points by changing internal Cref1 value similarly to 1st capacitance point measurement
optionally: perform cross-IC measurements using the other Cref2, Cref3, . . . , Crefz on-chip capacitors
repeat above measurements for IC2, IC3, ICz; each IC stage measures the same on-chip reference capacitors Cref1 from IC1 (not its own Cref2/3/ . . . /z)
extract all offset and gain errors for each stage and correct to equalize all stages; e.g. digital/software post-processing correction on the codes using simple linear regression on 2 points (or more)

The circuit of FIG. 6 also allows an absolute capacitance calibration by means of an external reference capacitor Cref,ext. This could be carried out for example as follows:
measure IC 1:
measure 1st capacitance point
connect internal Cref1 to stage 11 CDC (disconnect Cref,ext, unused); Cref1 value may be typically selected to be 0 fF capacitance
measure Cref1 with CDC stage 11; store code 11
repeat above step for stages 12, 13, . . . , 1x; store all stage codes
measure 2nd capacitance point
connect external Cref,ext to stage 11 CDC (disconnect Cref1, unused)
measure Cref,ext with CDC stage 11; store code 11
repeat above step for stages 12, 13, . . . , 1x; store all stage codes
(optional: measure more capacitance points by changing internal Cref1 value similarly to 1st capacitance point measurement)
repeat above measurements for IC2, IC3, ICz; each IC stage measures the same reference capacitors, i.e. Cref1 and Cref,ext in this case
extract all offset and gain errors for each stage and correct to equalize all stages; e.g. digital/software post-processing correction on the codes using linear regression on 2 or more points.

In the case of daisy chained CR lines 174, 175, 176 as shown in FIG. 7, the same calibration procedures as proposed above can be used, but by selectively connecting pairs of adjacent circuits to the reference line by acting selectively on the switches 188, calibrating the circuits in each adjacent pair with respect to each other, and finally combining the result in a global calibration using the overlaps, for example as follows:
measurement and calibration of IC1 & IC2
measurement and calibration of IC2 & IC3
measurement and calibration of IC3 & ICz
combining gain/slope error corrections among IC1, IC2, IC3, ICz According to a possible variant of the invention, the integrated circuits may comprise means to determine the value of the internal reference capacitors 173 by charging them with a known current and measuring the time needed to reach a given voltage. In this manner, if the circuits include or have access to precise current and voltage references, the absolute values of the internal reference capacitors 173 can be accurately measured, and an absolute calibration of the CDC stages obtained.

In a variant of the above calibration, the integrated circuit could include or have access to a shared current or voltage reference whose absolute value is not precisely known. The integrated circuits can however charge the reference capacitors with a stable current tied to the shared reference and, in this manner their gains can be at least equalized among the IC and stages, even if the absolute value is not precisely defined.

The invention claimed is:

1. A readout apparatus connectable to a capacitive touch panel comprising a plurality of capacitive readout integrated circuits, each of which includes a plurality of capacitance-measuring units arranged to provide a signal representative of a capacity of electrodes on the capacitive touch panel, and for each integrated circuit at least one calibration terminal, the calibration terminals of the capacitive readout integrated circuits being interconnected through one or more than one common reference lines, said readout apparatus having at least ore reference capacitor, the capacitive readout integrated circuits having a calibration mode in which they are arranged to connect the reference capacitor to the capacity-measuring units through their respective calibration terminal and the common reference lines, measure the capacity of the reference capacitor in floating mode and calibrate their response.

2. The readout apparatus of claim 1, wherein the capacitive readout unit is a capacity converter.

3. The readout apparatus of claim 1, in which the value of the reference capacitors can be varied.

4. The readout apparatus of claim 1, wherein the common reference capacitor is not comprised in the capacitive readout integrated circuits.

5. The readout apparatus of claim 1, wherein the common reference capacitor is one reference capacitor of a readout circuit.

6. The readout apparatus of claim 1, including a guard electrode connected to a modulation voltage source and to a common reference electrode of the capacitive touch panel.

7. The readout apparatus of claim including means to measure the capacity of the reference capacitors by the time needed to charge them to a determined value with a determined current.

8. The readout apparatus of claim 1, including a stimulation mode selector unit operatively arranged to apply an AC modulation signal to one of said common reference lines when the calibration mode is active.

* * * * *